United States Patent
Kim et al.

(10) Patent No.: US 10,396,306 B2
(45) Date of Patent: Aug. 27, 2019

(54) ELECTROLUMINESCENT DEVICE CAPABLE OF IMPROVING LUMINOUS EFFICIENCY BY PREVENTING A LEAKAGE CURRENT AND IMPROVING ELECTRON TRANSPORT PROPERTIES AND A DISPLAY DEVICE INCLUDING THE SAME

(71) Applicant: SAMSUNG ELECTRONICS CO., LTD., Suwon-si, Gyeonggi-do (KR)

(72) Inventors: Sung Woo Kim, Hwaseong-si (KR); Tae Ho Kim, Suwon-si (KR); Kun Su Park, Seongnam-si (KR); Chan Su Kim, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/970,252

(22) Filed: May 3, 2018

(65) Prior Publication Data
US 2019/0198796 A1 Jun. 27, 2019

(30) Foreign Application Priority Data
Dec. 27, 2017 (KR) .................. 10-2017-0181077

(51) Int. Cl.
*H01L 51/54* (2006.01)
*H01L 51/50* (2006.01)
(Continued)

(52) U.S. Cl.
CPC ....... *H01L 51/5072* (2013.01); *G09G 3/3208* (2013.01); *H01L 51/504* (2013.01);
(Continued)

(58) Field of Classification Search
CPC .............. H01L 51/5076; H01L 51/508; H01L 51/5024; H01L 51/504; H01L 51/5072
See application file for complete search history.

(56) References Cited

U.S. PATENT DOCUMENTS

| 7,972,712 B2 | 7/2011 | Itoh et al. |
| 2007/0020483 A1* | 1/2007 | Park .................. H01L 51/508 428/690 |

FOREIGN PATENT DOCUMENTS

| CN | 105720205 A | 6/2016 |
| JP | 2014154714 A | 8/2014 |

(Continued)

OTHER PUBLICATIONS

Rifat Kacar, et al., "Highly efficient inverted organic light emitting diodes by inserting a zinc oxide/polyethyleneimine (ZnO:PEI) nano-composite interfacial layer", Nanotechnology 28, 2017, 10 pp.

*Primary Examiner* — Ermias T Woldegeorgis
(74) *Attorney, Agent, or Firm* — Cantor Colburn LLP

(57) ABSTRACT

An electroluminescent device, a method of manufacturing the same, and a display device including the same are disclosed. The electroluminescent device electroluminescent device includes a first electrode; a hole transport layer disposed on the first electrode; an emission layer disposed on the hole transport layer and including at least two light emitting particles; a first electron transport layer disposed on the emission layer and including at least two inorganic-organic composite particles; a second electron transport layer disposed on the first electron transport layer and including at least two inorganic oxide particles; and a second electrode disposed on the second electron transport layer, wherein the first electron transport layer has a lower work function than the second electron transport layer.

16 Claims, 9 Drawing Sheets

(51) Int. Cl.
*G09G 3/3208* (2016.01)
*H05B 33/20* (2006.01)
*H01L 51/52* (2006.01)

(52) U.S. Cl.
CPC ........ *H01L 51/508* (2013.01); *H01L 51/5024* (2013.01); *H01L 51/5056* (2013.01); *H01L 51/5076* (2013.01); *H01L 51/5203* (2013.01); *H05B 33/20* (2013.01)

(56) References Cited

FOREIGN PATENT DOCUMENTS

| | | | |
|---|---|---|---|
| KR | 1020110132165 | A | 12/2011 |
| KR | 1020130074815 | A | 7/2013 |
| KR | 101437271 | B1 | 8/2014 |
| KR | 1020150107249 | A | 9/2015 |
| KR | 101599906 | B1 | 2/2016 |
| KR | 101620870 | B1 | 5/2016 |
| KR | 101626525 | B1 | 5/2016 |

\* cited by examiner

ELECTROLUMINESCENT DEVICE CAPABLE OF IMPROVING LUMINOUS EFFICIENCY BY PREVENTING A LEAKAGE CURRENT AND IMPROVING ELECTRON TRANSPORT PROPERTIES AND A DISPLAY DEVICE INCLUDING THE SAME

CROSS-REFERENCE TO RELATED APPLICATION

This application claims priority to Korean Patent Application No. 10-2017-0181077 filed in the Korean Intellectual Property Office on Dec. 27, 2017, and all the benefits accruing therefrom under 35 U.S.C. § 119, the entire content of which is incorporated herein by reference.

BACKGROUND

1. Field

An electroluminescent device and a display device comprising the same are disclosed.

2. Description of the Related Art

Quantum dots are a nanocrystal semiconductor material having a diameter of less than or equal to around 10 nanometers (nm), which show, e.g., exhibit, quantum confinement effects. Quantum dots generate stronger light in a narrow wavelength region than the commonly used phosphor. Quantum dots emit light when the excited electrons are transitioned from a conduction band to a valance band and emitted wavelengths are changed depending upon a particle size, e.g., the wavelength of light emitted by quantum dots varies with particle size of the quantum dots, even in the same material. As quantum dots with a relatively smaller particle size emit light of a relatively shorter wavelength, light in a desirable wavelength may be obtained by adjusting sizes of the quantum dots.

In other words, production costs of electronic devices including an emission layer including quantum dots may be decreased, compared to an organic light emitting diode including an emission layer including phosphorescent and/or phosphor material, and desirable color may be emitted by changing a size of quantum dots, without the need to include other organic materials in the emission layer for emitting light of other colors.

SUMMARY

An electroluminescent device capable of improving luminous efficiency by preventing a leakage current and improving electron transport properties and a display device including the same are provided.

According to an embodiment, an electroluminescent device includes a first electrode; a hole transport layer disposed on the first electrode; an emission layer disposed on the hole transport layer and including at least two light emitting particles; a first electron transport layer disposed on the emission layer and including at least two inorganic-organic composite particles; a second electron transport layer disposed on the first electron transport layer and including at least two inorganic oxide particles; and a second electrode disposed on the second electron transport layer, wherein the first electron transport layer has a lower work function than the second electron transport layer.

Each of the inorganic-organic composite particles may include an inorganic material core and at least two organic polymers bound to a surface of the inorganic material core.

The organic polymers may be present in an amount in a range of about 3 weight percent (wt %) to about 20 wt %, based on a total amount of the first electron transport layer.

The organic polymers may include at least one of an imine compound, an imine compound, an alcohol compound, an acrylic compound, a glycol compound, or a derivative thereof.

The inorganic material core may include at least one of ZnO, $TiO_2$, $ZrO_2$, $SnO_2$, $WO_3$, $Ta_2O_3$, or a combination thereof.

An average particle diameter of the inorganic material core may be less than or equal to about 100 nanometers (nm).

A difference between lowest unoccupied molecular orbital (LUMO) energy levels of the first electron transport layer and the second electron transport layer may be greater than about 0 electronvolts (eV) and less than or equal to about 0.5 eV.

The second electron transport layer may be directly on the first electron transport layer.

The first electron transport layer may have a thickness in a range of about 5 nm to about 25 nm.

The second electron transport layer may have a thickness in a range of about 15 nm to about 35 nm.

The second electron transport layer may consist of the at least two inorganic oxide particles.

The inorganic oxide particles may include at least one of ZnO, $TiO_2$, $ZrO_2$, $SnO_2$, $WO_3$, $Ta_2O_3$, or a combination thereof.

At least one of the light emitting particles may have a core-shell structure.

At least one of the light emitting particles may include a Group II-VI compound that does not include Cd, a Group III-V compound, a Group IV-VI compound, a Group IV element or compound, a Group compound, a Group I-II-IV-VI compound that does not include Cd, or a combination thereof.

The first electron transport layer may have a higher LUMO energy level than the second electron transport layer, and the emission layer may have a same LUMO energy level as the first electron transport layer or a higher LUMO energy level than the first electron transport layer.

According to an embodiment, a display device includes the electroluminescent device.

An electroluminescent device may have improved luminous efficiency by preventing a leakage current and improving electron transport properties.

As described above, a display device including an electroluminescent device having improved luminous efficiency may be provided.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
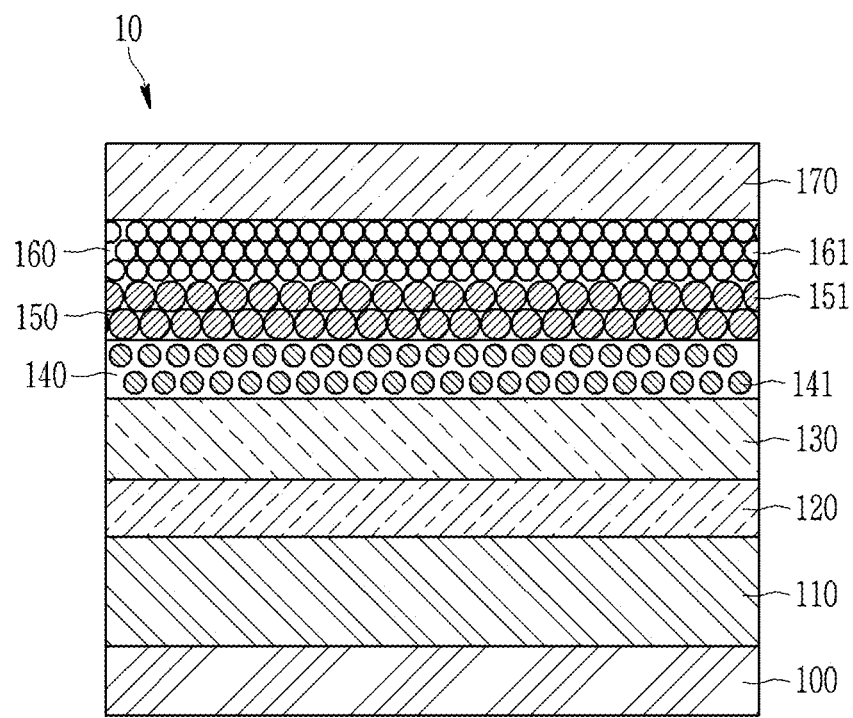
FIG. 1 is a schematic cross-sectional view of an electroluminescent device according to an embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, "group" may refer to a group of Periodic Table.

As used herein, "Group II" may refer to Group IIA and Group IIB, and examples of Group II metal may be Cd, Zn, Hg, and Mg, but are not limited thereto.

As used herein, examples of "Group II metal that does not include Cd" may refer to a Group II metal except Cd, for example Zn, Hg, Mg, etc.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si. As used herein, "Group I" may refer to Group IA and Group IB, and examples may include Li, Na, K, Ru, and Cs, but are not limited thereto.

As used herein, "Group V" may refer to Group VA, and examples may include nitrogen, phosphorus, arsenic, antimony, and bismuth, but are not limited thereto.

As used herein, "Group VI" may refer to Group VIA, and examples may include sulfur, selenium, and tellurium, but are not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The luminous efficiency of an emission layer including quantum dots is determined by quantum efficiency of quantum dots, a balance of charge carriers, light extraction efficiency, a leakage current, and the like. That is, in order to improve luminous efficiency of an emission layer, controlling excitons to be confined in an emission layer, smoothly, e.g., easily, transporting holes and electrons of a quantum dot, or preventing a leakage current are desirably provided.

In an embodiment, for a particle diameter of a particle in the present disclosure, although it may be quantified by a measurement to determine an average size of a group, the generally used method includes a mode diameter showing the maximum value of the distribution, a median diameter corresponding to the center value of integral distribution curve, a variety of average diameters (numeral average, length average, area average, mass average, volume average, etc.), and the like. Unless particularly mentioned otherwise, an average particle diameter refers to a numeral average diameter in the present disclosure, and it is obtained by measuring D50 (median particle diameter).

FIG. 1 is a schematic cross-sectional view of an electroluminescent device according to an embodiment.

An electroluminescent device 10 according to an embodiment includes a first electrode 110, a hole injection layer 120 disposed on the first electrode 110, a hole transport layer 130 disposed on the hole injection layer 120, an emission layer 140 disposed on the hole transport layer 130 and including at least two light emitting particles 141, a first electron transport layer 150 disposed on the emission layer 140 and consisting of inorganic-organic composite particles 151, a second electron transport layer 160 disposed on the first electron transport layer 150 and including at least two inorganic oxide particles 161, and a second electrode 170 disposed on the second electron transport layer 160.

That is, the electroluminescent device 10 has a stack structure wherein the hole injection layer 120, the hole transport layer 130, the emission layer 140, the first electron transport layer 150, and the second electron transport layer 160 are disposed between the first electrode 110 and the second electrode 170 facing each other.

The electroluminescent device 10 according to an embodiment supplies current to the emission layer 140 through the first electrode 110 and the second electrode 170, and causes electro-luminescence of the light emitting particles 141 to generate light. The electroluminescent device 10 may generate light in various wavelength regions according to materials, sizes, or fine structures of the light emitting particle 141 of the emission layer 140.

In an embodiment, the first electrode 110 may be directly connected to a driving power source so may function to flow current to the emission layer 140. The first electrode 110 may include a material having light transmittance in at least the visible light wavelength region, but is not limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

In an embodiment, the first electrode 110 may be disposed on the substrate 100 as shown in FIG. 1. The substrate 100 may be a transparent insulating substrate or may be made of a ductile material. The substrate 100 may include glass or a polymer material in a film having a glass transition temperature (Tg) of greater than about 150° C. For example, the substrate it may include a COC (cyclo olefin copolymer) or COP (cyclo olefin polymer) based material.

In an embodiment, the substrate 100 may support the hole injection layer 120, the hole transport layer 130, the emission layer 140, the first electron transport layer 150, and the second electron transport layer 160 disposed between the first electrode 110 and the second electrode 170. However, the first electrode 110 of the electroluminescent device 10 according to an embodiment is not necessarily disposed on the substrate 100, but it may be disposed on the second electrode 170 or may be omitted.

The second electrode 170 includes an optically transparent material and may function as a light-transmitting electrode to transmit light generated in the emission layer 140. In an embodiment, the second electrode 170 may include at least one of silver (Ag), aluminum (Al), copper (Cu), gold (Au), or an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof.

Each of the first electrode 110 and the second electrode 170 may be formed by depositing a material for forming an electrode on the substrate 100 or an organic layer by a method such as sputtering.

According to an embodiment, the hole injection layer 120 may be disposed between the first electrode 110 and the hole transport layer 130. The hole injection layer 120 may supply holes into the emission layer 140 together with the hole transport layer 130. However, the hole injection layer 120 may be omitted considering the thickness and the material of the hole transport layer 130.

The hole injection layer 120 may be formed of a p-type semiconductor material or a material doped with a p-type dopant. For example, the hole injection layer 120 may include a PEDOT [poly(3,4-ethylenedioxythiophene)] derivative, a PSS [poly(styrene sulfonate)] derivative, a poly-N-vinylcarbazole (PVK) derivative, a polyphenylenevinylene derivative, a poly p-phenylene vinylene (PPV) derivative, a polymethacrylate derivative, a poly(9,9-octylfluorene) derivative, a poly(spiro-fluorene) derivative, TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly(9,9'-dioctylfluorene-co-N-(4-butylphenyl)diphenylamine)), PFB (poly(9,9-dioctylfluorene)-co-N,N-diphenyl-N,N-di-(p-butylphenyl)-1,4-diaminobenzene), poly-TPD, a metal oxide such as NiO and MoO$_3$, or a combination thereof, but is not limited thereto.

The hole transport layer 130 may be disposed on the first electrode 110, between the first electrode 110 and the emission layer 140 and/or between the hole injection layer 120 and the emission layer 140. The hole transport layer 130 may provide and transport holes into the emission layer 140. The hole transport layer 130 is formed directly under the emission layer 140 and directly contacts the emission layer 140.

In an embodiment, the hole transport layer 130 may be formed of a p-type semiconductor material or a material doped with a p-type dopant. For example, the hole transport layer 130 may include a PEDOT [poly (3,4-ethylenedioxythiophene)] derivative, a PSS [poly(styrene sulfonate)] derivative, a poly-N-vinylcarbazole (PVK) derivative, a polyphenylenevinylene derivative, a poly p-phenylene vinylene (PPV) derivative, a polymethacrylate derivative, a poly(9,9-octylfluorene) derivative, a poly(spiro-fluorene) derivative, TPD (N,N'-diphenyl-N,N'-bis(3-methylphenyl)-(1,1'-biphenyl)-4,4'-diamine), NPB (N,N'-di(naphthalen-1-yl)-N—N'-diphenyl-benzidine), m-MTDATA (tris(3-methylphenylphenylamino)-triphenylamine), TFB (poly(9,9'-dioctylfluorene-co-N-(4-butylphenyl)diphenylamine)), PFB (poly(9,9-dioctylfluorene)-co-N,N-diphenyl-N,N-di-(p-butylphenyl)-1,4-diaminobenzene), poly-TPD, a metal oxide such as NiO and MoO$_3$, or a combination thereof, like the hole injection layer 120, but is not limited thereto.

This hole transport layer 130 increases a life-span of a luminescent device and lowers a turn-on voltage at which the electroluminescent device 10 starts to work. Particularly, the hole transport layer 130 formed of a polymer material such as PEDOT, PSS, PPV, PVK, TFB, PFB, poly-TPD, or the like may have relatively strong resistance characteristics against a harmful material such as oxygen, moisture, or the like compared with a low molecular organic material and high resistance about, e.g., against, crystallization.

The hole transport layer 130 may be formed in a wet coating method such as spin coating and the like. For example, when the polymer such as PPV and the like is used to form a thin film on the first electrode 110, the hole transport layer 130 formed as a PPV thin film is obtained by spin-coating a precursor solution including a PPV precursor polymer and a methanol organic solvent on the first electrode 110 and heat-treating it, for example, under an inert gas atmosphere of $N_2$ or vacuum at about 250° C. to about 300° C. for about 3 hours.

The emission layer 140 may include at least two light emitting particles. The emission layer 140 is a site where electrons and holes transported by a current supplied from the first electrode 110 and the second electrode 170, the electrons and holes are combined in the emission layer 140 to generate excitons, and the generated excitons are transitioned from an exited state to a ground state to emit light in a wavelength corresponding to the size of the light emitting particles 141.

On the other hand, the emission layer 140 may emit light in a predetermined wavelength region. The predetermined wavelength region belongs to a visible light region, for example, one among a first wavelength region of about 380 nm to about 488 nm, a second wavelength region of about 490 nm to about 510 nm, a third wavelength region of about 510 nm to about 580 nm, a fourth wavelength region of about 582 nm to about 600 nm, and a fifth wavelength region of about 620 nm to about 680 nm.

In an embodiment, the light emitting particles 141 may include quantum dots. That is, the light emitting particles 141 may consist of, e.g., include only, quantum dots, or one of the light emitting particle 141 may consist of quantum dots and the other may include, e.g., consist of, light emitting elements, for example commercially available phosphors that are separate, e.g., distinct, from quantum dots.

The quantum dot has a discontinuous energy bandgap by, e.g., due to, the quantum confinement effect and incident light may be converted into light having a particular wavelength and then radiated. When the light emitting particle 141 consists of quantum dots, the emission layer 140 may produce light having excellent color reproducibility and color purity.

In an embodiment, a material of the quantum dot is not particularly limited and known or commercially available quantum dots may be used. For example, each light emitting particle 141 according to an embodiment may include a Group II-VI compound that does not include Cd, a Group III-V compound, a Group IV-VI compound, a Group IV element or compound, a Group compound, a Group I-II-IV-VI compound that does not include Cd, or a combination thereof. That is, each light emitting particle 141 according to an embodiment may be a non-cadmium quantum dot, e.g., a quantum dot that does not including cadmium. When the light emitting particle 141 is a quantum dot including, e.g., consisting of, a non-cadmium material, e.g., a material that does not include cadmium, the quantum dot has reduced, e.g., no, toxicity compared with a conventional cadmium quantum dot and thus is not dangerous and is environmentally-friendly.

The Group II-VI compound may be ZnS, ZnSe, ZnTe, ZnO, HgS, HgSe, HgTe, MgSe, MgS, or a mixture thereof; ZnSeS, ZnSeTe, ZnSTe, HgSeS, HgSeTe, HgSTe, HgZnS, HgZnSe, HgZnTe, MgZnSe, MgZnS, or a mixture thereof; or HgZnTeS, HgZnSeS, HgZnSeTe, HgZnSTe, or a mixture thereof. The Group II-VI compound may further include a Group III metal.

The Group III-V compound may be GaN, GaP, GaAs, GaSb, AlN, AlP, AlAs, AlSb, InN, InP, InAs, InSb, or a mixture thereof; GaNP, GaNAs, GaNSb, GaPAs, GaPSb, AlNP, AlNAs, AlNSb, AlPAs, AlPSb, InNP, InNAs, InNSb, InPAs, InPSb, InZnP, or a mixture thereof; or GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof. The Group III-V compound may further include a Group II metal (InZnP).

The Group IV-VI compound may be SnS, SnSe, SnTe, PbS, PbSe, PbTe, or a mixture thereof; SnSeS, SnSeTe, SnSTe, PbSeS, PbSeTe, PbSTe, SnPbS, SnPbSe, SnPbTe, or a mixture thereof; or SnPbSSe, SnPbSeTe, SnPbSTe, or a mixture thereof. Examples of the Group compound may be $CuInSe_2$, $CuInS_2$, CuInGaSe, and CuInGaS, are not limited thereto. Examples of the Group I-II-IV-VI compound may be CuZnSnSe and CuZnSnS, are not limited thereto. Examples of the Group IV compound may be Si, Ge, or a mixture thereof; or SiC, SiGe, or a mixture thereof.

The binary element compound, the ternary element compound or the quaternary element compound respectively exist in a uniform concentration in the particle or in partially different concentrations in the same particle.

According to an embodiment, the quantum dot may have a core-shell structure including one semiconductor nanocrystal core and another semiconductor nanocrystal shell surrounding the core. The core and the shell may have a concentration gradient wherein the concentration of the element(s) of the shell decreases toward the core. In addition, the quantum dot may have one semiconductor nanocrystal core and multiple shells surrounding the core. Herein, the multi-layered shell structure has a structure of two or more shells and each layer may have a single composition or an alloy or may have a concentration gradient.

In an embodiment, the light emitting particle may have a core-shell structure. When the light emitting particle has a core-shell structure, a material composition of the shell has a larger energy bandgap than that of the core, which may exhibit an effective quantum confinement effect However, embodiments are not limited thereto. In the multi-layered shell, a shell that is outside of the core has may have a higher energy bandgap than a shell that is near to the core and the quantum dot may have ultraviolet (UV) to infrared wavelength ranges.

The quantum dot may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even 100%.

In a display, the quantum dot may have a relatively narrow spectrum and may improve color purity or color reproducibility. The quantum dot may have for example a full width at half maximum (FWHM) of a photoluminescence wavelength spectrum of less than or equal to about 45 nm, less than or equal to about 40 nm, or less than or equal to or about 30 nm. Within these ranges, color purity or color reproducibility of a device may be improved.

The quantum dot may have a particle diameter (the longest diameter for a non-spherically shaped particle) of about 1 nm to about 100 nm. For example, the quantum dot may have a particle diameter of about 1 nm to about 20 nm, for example, about 2 nm (or about 3 nm) to about 15 nm.

In addition, a shape of the quantum dot is not be particularly limited. For example, the quantum dot may have a spherical, oval, tetrahedral, pyramidal, cuboctahedral, cylindrical, polyhedral, multi-armed, cube nanoparticle, nanotube, nanowire, nanofiber, nanosheet, or a combination thereof. A plurality of quantum dots may have any cross-sectional shape, including different cross-sectional shapes.

The quantum dot is commercially available or may be synthesized by any suitable method. For example, several nano-sized quantum dots may be synthesized according to a wet chemical process. In the wet chemical process, precursors react in an organic solvent to grow crystal particles, and the organic solvent or a ligand compound may coordinate, e.g., bind to, the surface of the quantum dot, controlling the growth of the crystal. Examples of the organic solvent and the ligand compound are known. The organic solvent coordinated on, e.g., bound to, the surface of the quantum dot may affect stability of a device, and thus excess organic materials that are not coordinated on the surface of the nanocrystals may be removed by pouring the organic solvent in excess non-solvent, and centrifuging the resulting mixture. Examples of the non-solvent may be acetone, ethanol, methanol, and the like, but are not limited thereto. After the removal of excess organic materials, the amount of the organic materials coordinated on the surface of the quantum dot may be less than or equal to about 50% by weight (wt %), for example, less than or equal to about 30 wt %, less than or equal to about 20 wt %, or less than or equal to about 10 wt % based on a weight of the quantum dot. The organic material may include a ligand compound, an organic solvent, or a combination thereof.

The quantum dot may have for example an organic ligand having a hydrophobic moiety bound to its surface. In an embodiment, the organic ligand having the hydrophobic moiety may be RCOOH, $RNH_2$, $R_2NH$, $R_3N$, RSH, $R_3PO$, $R_3P$, ROH, RCOOR', RPO$(OH)_2$, $R_2POOH$ (wherein, R and R' are independently a C5 to C24 alkyl group, a C5 to C24 alkenyl group, a C5 to C20 alicyclic group, or a C5 to C20 aryl group), a polymeric organic ligand, or a combination thereof. The organic ligand may be a mono-functional group organic ligand and the functional group may be bound to the surface of the quantum dot.

In an embodiment, the first and second electron transport layers 150 and 160 are disposed between the emission layer 140 and the second electrode 170 and thus transport electrons into the emission layer 140.

A sum thickness of the first and second electron transport layers 150 and 160 may be variously changed considering a charge carrier balance of the hole injection layer 120, the hole transport layer 130, and the emission layer 140 in the device, but may be for example greater than or equal to about 30 nm, greater than or equal to about 35 nm, or greater than or equal to about 40 nm and for example less than or equal to about 80 nm, less than or equal to about 70 nm, less than or equal to about 60 nm, less than or equal to about 50 nm, or less than or equal to about 40 nm.

In the electroluminescent device 10 according to an embodiment, the first electron transport layer 150 and the second electron transport layer 160 may have different bandgap energy levels from each other. More specifically, the first electron transport layer 150 has a lower work function compared with the second electron transport layer 160. Thus, electrons may be easily transported from the second electrode 170 to first electron transport layer 150 through the second electron transport layer 160.

A difference between LUMO (Lowest Unoccupied Molecular Orbital) energy levels may be less than or equal to about 0.7 eV, less than or equal to about 0.6 eV, less than or equal to about 0.5 eV, or less than or equal to about 0.4 eV, and for example greater than or equal to about 0.1 eV or greater than or equal to about 0.2 eV.

The first electron transport layer 150 may have a higher LUMO energy level than the second electron transport layer 160 and the emission layer 140 may have the same LUMO energy level as or greater LUMO energy level than the first electron transport layer 150. Accordingly, electrons may be sequentially transported from the second electron transport layer 160 to the emission layer 140 through the first electron transport layer 150.

Figure 2:
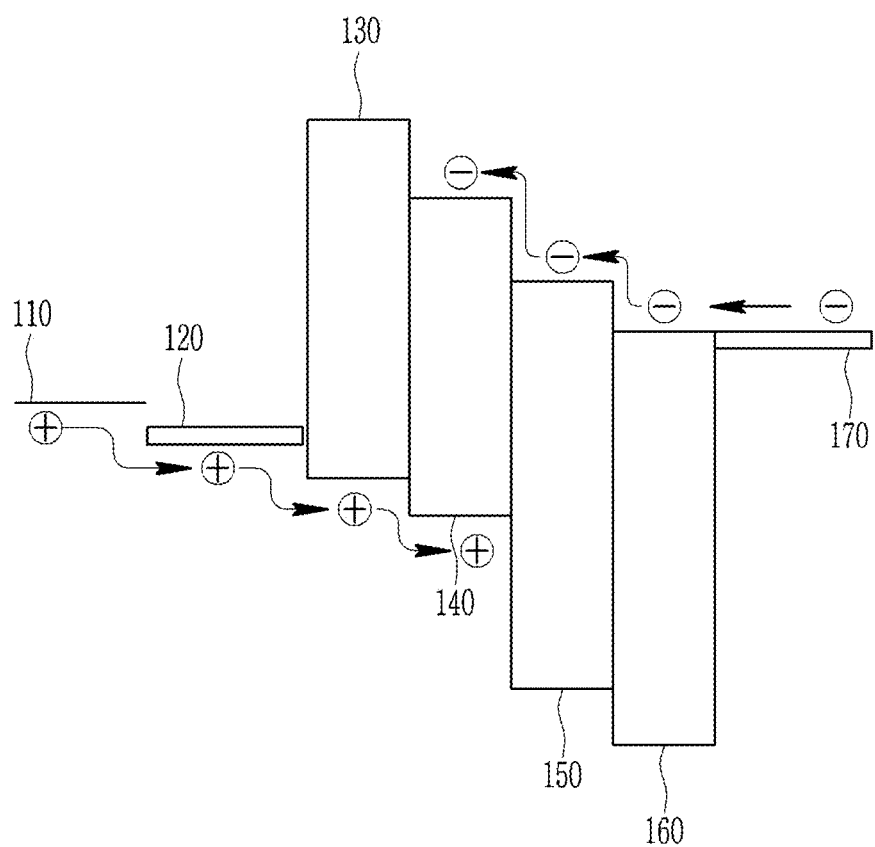
FIG. 2 shows an energy band diagram of an electroluminescent device according to an embodiment.

FIG. 2 shows an energy band diagram of an electroluminescent device according to an embodiment.

For example, when the emission layer includes non-cadmium quantum dots, the emission layer and the second electron transport layer may have a LUMO energy level difference of greater than or equal to about 1.0 eV. Accordingly, when electrons are directly transported from the second electron transport layer to the emission layer without a first electron transport layer, the LUMO energy level difference of about 1.0 eV may work as an electron transport barrier and thus hinder smooth transportation of the electrons.

However, the electroluminescent device 10 according to an embodiment lowers an electron injection barrier from the second electron transport layer 160 to the first electron transport layer 150 by disposing the first electron transport layer 150 having a less than or equal to a LUMO energy level of that of the emission layer 140 between the second electron transport layer 160 and the emission layer 140, as shown in FIG. 2. As a result, electrons may be sequentially transported along the second electrode 170, the second electron transport layer 160, and the first electron transport layer 150 and finally to the emission layer 140, as shown in FIG. 2.

In other words, the electroluminescent device 10 according to an embodiment may show improved electron transport properties by disposing the first and second electron transport layers 150 and 160 having a different bandgap energy level as a double layer as described above.

The first electron transport layer 150 is formed right, e.g., directly, on the emission layer 140 and transports electrons to the emission layer 140. The first electron transport layer 150 may be formed of at least two inorganic-organic composite particles 151. In other words, first electron transport layer 150 may be a cluster layer formed of at least two inorganic-organic composite particles 151 as shown in FIGS. 1 and 2.

Figure 3:
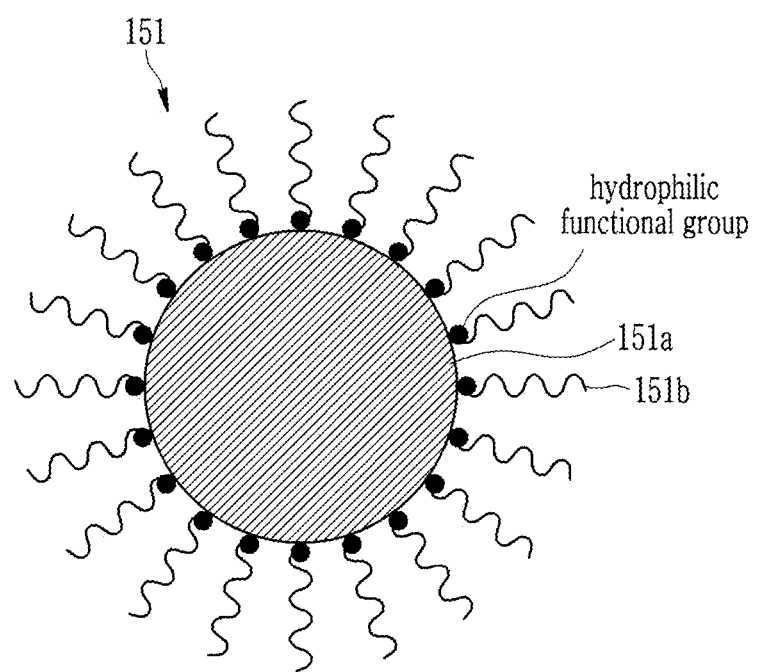
FIG. 3 is an enlarged schematic view of inorganic-organic composite particles in an electroluminescent device according to FIG. 1.

FIG. 3 is a schematic view enlarging the inorganic-organic composite particles 151 coated with an organic polymer 151b in the electroluminescent device 10 of FIG. 1.

Referring to FIG. 3, the inorganic-organic composite particles 151 may include an inorganic material core 151a and at least two organic polymers 151b bound to the surface of the inorganic material core 151a. At least two organic polymers 151b may be attached on the surface of the inorganic material core 151a through a hydrophilic functional group on the surface of the inorganic material core 151a.

However, an embodiment is not necessarily limited thereto, but a part of at least two organic polymers may directly have a chemical bond with the inorganic material core 151a, e.g., not through the hydrophilic functional group. The inorganic material core 151a may be formed of a material having electron transport properties. The inorganic material core 151a according to an embodiment may be, for example, formed of inorganic oxide such as ZnO, $TiO_2$, $ZrO_2$, $SnO_2$, $WO_3$, $Ta_2O_3$, or a combination thereof but is not limited thereto.

When the first electron transport layer 150 includes the above an inorganic material core 151a, the emission layer 140 including non-cadmium quantum dots generates a large amount of charge-exchange excitons due to internal exothermicity during operation of the device, but the generated charge-exchange excitons do not emit light but may be extinct and emit auger electrons on the interface of the emission layer 140. Since the emitted auger electrons are recombined with holes inside the emission layer 140 and emit light, roll-off, e.g., efficiency roll-off, of the electroluminescent device 10 in a high luminance region may be minimized.

An average particle diameter of the inorganic material core 151a according to an embodiment may be for example less than or equal to about 150 nm, less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm and for example greater than or equal to about 1 nm, greater than or equal to about 2 nm, greater than or equal to about 3 nm, greater than or equal to about 4 nm, or greater than or equal to about 5 nm.

The electroluminescent device 10 according to an embodiment has the first electron transport layer 150 including the inorganic material cores 151a having a nano scale range and thus shows excellent, e.g., improved, electron mobility compared with that of a conventional inorganic or organic semiconductor film. Accordingly, light emitting stability and luminance of the non-cadmium quantum dots may be improved through the first electron transport layer 150.

On the other hand, the organic polymers 151b bound to the surface of the inorganic material core 151a, as shown in FIG. 3, may have a hydrophilic moiety for being bonded with a hydrophilic functional group such as a hydroxide group (—OH) and the like present on the surface of the inorganic material core 151a.

In addition, the organic polymers 151b may be an organic material having electron transport properties. Examples of the organic polymers 151b simultaneously having the hydrophilic moiety and the electron transport properties may include an imine compound, an alcohol compound, an acryl compound, a glycol compound, or a derivative thereof. For example, the organic polymers 151b may be an imine compound derivative, for example, polyethyleneimine.

The organic polymers 151b may modify the surface of the inorganic material core 151a and thus change various characteristics of the inorganic material core 151a, for example, electrical, chemical, and optical properties. For example, when the inorganic material core 151a formed of an inorganic oxide is used, the surface of the inorganic material core 151a is modified to have a hydrophilic moiety by the organic polymers 151b, and thus the inorganic-organic composite particles 151 overall exhibits hydrophilicity. In addition, the inorganic-organic composite particles 151 surface-modified by the organic polymers 151b may have lower light absorbance in an absorption wavelength range of the inorganic material core 151a than that of the inorganic material core 151a. On the other hand, the inorganic-organic composite particles 151 may change electron transport characteristics of the inorganic material core 151a and the organic polymers 151b. Accordingly, the inorganic-organic composite particles 151 may have a different bandgap energy level from that of the inorganic material core 151a.

For the surface modification of the inorganic material core 151a by the organic polymers 151b, the organic polymers 151b may be included in an amount of less than or equal to about 20 wt %, for example, less than or equal to about 15 wt %, less than or equal to about 10 wt %, less than or equal to about 5 wt % and for example, greater than or equal to about 1 wt %, greater than or equal to about 3 wt %, or greater than or equal to about 5 wt % based on an total weight of the first electron transport layer 150. When the organic polymers 151b is included within these range of the first electron transport layer 150, the inorganic-organic composite particles 151 may show surface modified characteristics as described above.

The inorganic-organic composite particles 151 may be synthesized by putting the organic polymers 151b including a hydrophilic moiety and the inorganic material core 151a in a hydrophilic solvent and using a sol-gel method at room temperature, but the synthesis is not necessarily limited thereto. The first electron transport layer 150 according to an embodiment is a cluster layer formed of the inorganic-organic composite particles 151 and thus shows electrical, chemical, optical properties, or a combination thereof due to the inorganic-organic composite particles 151.

In order to show the above characteristics, a thickness of the first electron transport layer 150 may be changed depending on a size and a kind, e.g., type, of the inorganic material core 151a and the organic polymer 151b, its charge carrier balance with the emission layer 140 and/or the second electron transport layer 160, and the like, for example, less than or equal to about 60 nm, less than or equal to about 50 nm, less than or equal to about 40 nm, less than or equal to about 30 nm, less than or equal to about 25 nm, and less than or equal to about 200 nm and for example, greater than or equal to about 5 nm, greater than or equal to about 10 nm, greater than or equal to about 15 nm, or greater than or equal to about 20 nm.

When the first electron transport layer 150 is thinner than the above thickness range, the first electron transport layer 150 may have a surface defect, but when the first electron transport layer 150 is thicker than the above thickness range, resistance inside the device may be increased, and thus electron transport properties may be deteriorated.

Figure 4:
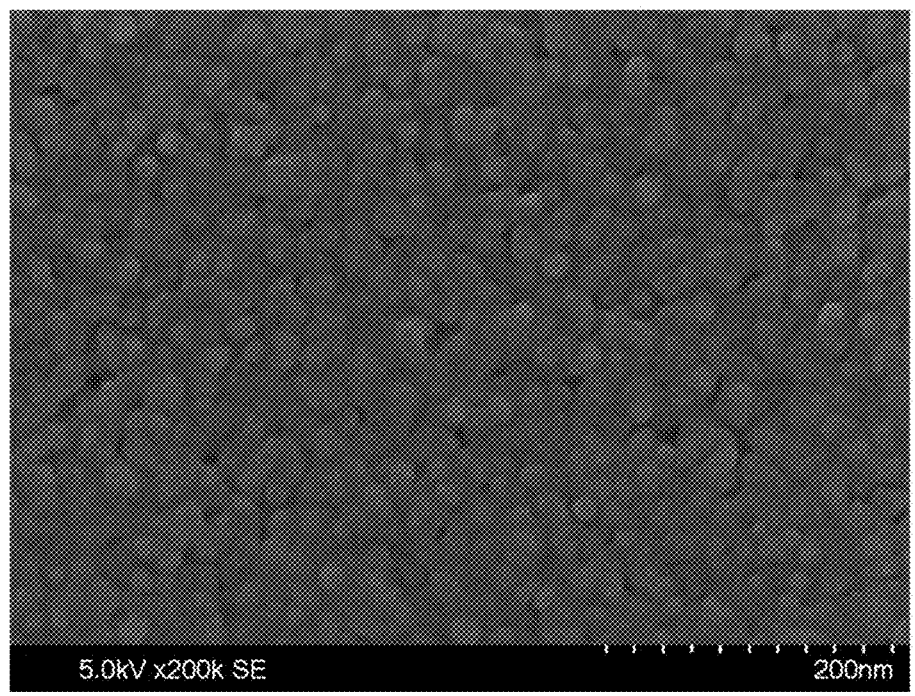
FIG. 4 shows a scanning electron microscope image of a general ZnO cluster layer surface.
Figure 5:
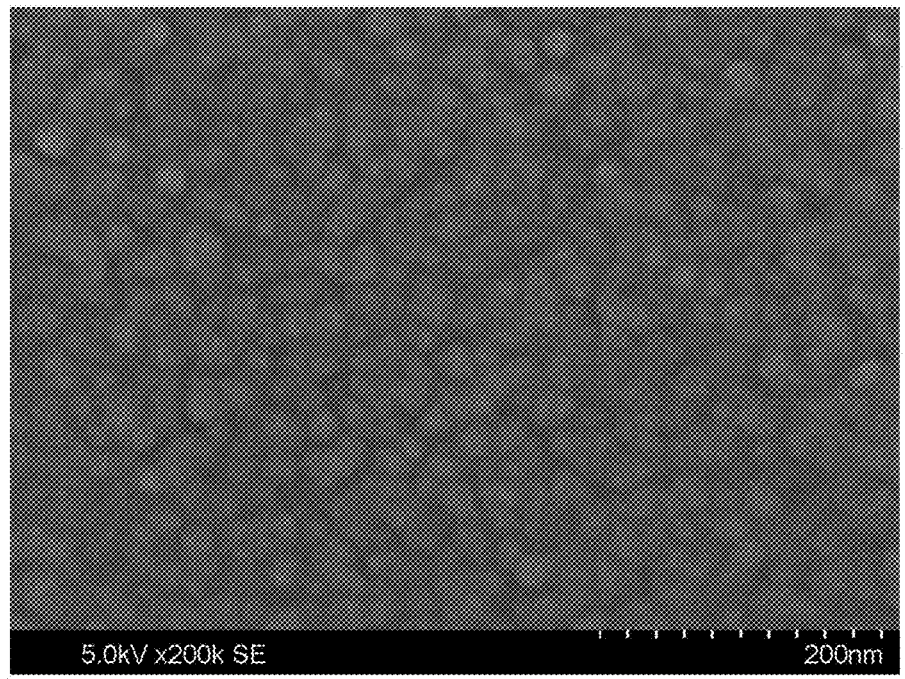
FIG. 5 shows a scanning electron microscope image of a first electron transport layer surface according to an embodiment.

FIG. 4 shows a scanning electron microscope image of the surface of a general ZnO cluster layer, and FIG. 5 shows a scanning electron microscope image of the surface of the first electron transport layer according to an embodiment.

ZnO particles are generally used as an inorganic electron transport layer material and have a plurality of hydroxide groups (—OH) on the surface and properties of being agglomerated at about 10° C. to about 30° C.

Accordingly, when these ZnO particles are used to form a ZnO cluster layer, the ZnO cluster layer shows unsatisfactory surface characteristics due to the agglomeration of the ZnO particles and has surface defects as shown in FIG. 4 and thus relatively unsatisfactory surface morphology.

These surface defects and the like may function as a leakage path of electrons during the electron transport and thus cause driving efficiency deterioration of a device such as an exciton extinction phenomenon, a leakage current, an unsmooth, e.g., a relatively difficult, transport of electrons to an emission layer, and the like.

In addition, in order to solve this deterioration problem, a surface-modifying layer on the ZnO cluster layer may be formed, but a charge carrier balance between the surface-modifying layer and the ZnO cluster layer are difficult to set, and since the surface-modifying layer has a higher work function than that of the ZnO cluster layer, electrons may rarely move, e.g., at an undesirably slow rate or in an undesirably low amount, from the ZnO cluster layer to the surface-modifying layer.

On the other hand, the electroluminescent device 10 according to an embodiment includes the first electron transport layer 150, which is a cluster layer formed of the inorganic-organic composite particles 151, and the inorganic-organic composite particles 151 are surface-modified by the hydrophobic organic polymers 151b and thus not agglomerated within the above temperature range. Accordingly, the first electron transport layer 150 formed of the inorganic-organic composite particles 151 according to an embodiment shows excellent surface morphology compared with that of a conventional ZnO cluster layer as shown in FIG. 5.

Accordingly, the electroluminescent device 10 according to an embodiment may minimize a leakage path of electrons transported to the emission layer 140 through the first electron transport layer 150 by forming the first electron transport layer 150 having relatively excellent surface morphology on the emission layer 140 as described above.

In addition, the electroluminescent device 10 according to an embodiment may be easily set to have a charge carrier balance, since the first electron transport layer 150 has a lower work function that that of the second electron transport layer 160, and thus electrons are easily transported from the second electron transport layer 160 to the first electron transport layer 150.

Accordingly, the electroluminescent device 10 according to an embodiment may be prevented from a leakage current and also show improved electron transportation property.

The first electron transport layer 150 may be formed in a wet coating method such as spin coating and the like. On the other hand, the first electron transport layer 150 in an embodiment may be formed along with the emission layer 140 or with the hole transport layer 130 and the emission layer 140.

For example, the hole transport layer 130, the emission layer 140, and the first electron transport layer 150 may be formed together by sequentially coating a composition for a hole transport layer, a composition for an emission layer thereon, and a composition for a first electron transport layer wherein the inorganic-organic composite particles 151 are dispersed in a hydrophilic solvent thereon and then, heat-treating the coated compositions, for example, under an inert gas atmosphere of $N_2$ or under vacuum.

The electroluminescent device 10 according to an embodiment may be simply, e.g., relatively easily, fabricated to include the hole transport layer 130, the emission layer 140, and the first electron transport layer 150 in a solution process, e.g., a process involving or taking place in a solution.

However, an embodiment is not limited thereto, but the hole transport layer 130, the emission layer 140, and the first electron transport layer 150 may be respectively formed depending on each material and the like in a separate process.

The second electron transport layer 160 may be positioned right on the first electron transport layer 150 and include at least two inorganic oxide particles 161. The second electron transport layer 160 performs a function of transporting electrons from the second electrode 170 to the first electron transport layer 150 as described above.

The second electron transport layer 160 according to an embodiment may include a cluster layer formed of at least two inorganic oxide particles 161. Otherwise, the second electron transport layer 160 may be a cluster layer formed of the inorganic oxide particles 161, but an embodiment is not limited thereto, and the cluster layer may be formed of an inorganic material or an organic material which is at least once alternatively deposited, e.g., the inorganic material is deposited followed by deposition of the organic material or the organic material is deposited followed by deposition of the inorganic material.

The inorganic oxide particle 161 may have electron transport properties. The inorganic oxide particle 161 according to an embodiment may include, for example, ZnO, $TiO_2$, $ZrO_2$, $SnO_2$, $WO_3$, $Ta_2O_3$, or a combination thereof but is not limited thereto.

An average particle diameter of the inorganic oxide particles 161 according to an embodiment may be for example less than or equal to about 150 nm, less than or equal to about 140 nm, less than or equal to about 130 nm, less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 20 nm, or less than or equal to about 10 nm and for example greater than or equal to about 1 nm, greater than or equal to about 2 nm, greater than or equal to about 3 nm, greater than or equal to about 4 nm, or greater than or equal to about 5 nm.

On the other hand, the thickness of the second electron transport layer 160 may be changed with a consideration of an average particle diameter of the inorganic oxide particles 161, a material, a charge carrier balance with the emission layer 140 and/or the first electron transport layer 150, and the like, for example, less than or equal to about 60 nm, less than or equal to about 50 nm, less than or equal to about 40 nm, less than or equal to about 35 nm, less than or equal to about 30 nm, less than or equal to about 25 nm, or less than or equal to about 20 nm and for example greater than or equal to about 5 nm, greater than or equal to about 7 nm, greater than or equal to about 10 nm, greater than or equal to about 15 nm, or greater than or equal to about 20 nm. When the thickness of the second electron transport layer 160 and the average particle diameter of the inorganic oxide particles 161 respectively satisfy the previously disclosed ranges, the second electron transport layer 160 may show excellent electron transport properties.

On the other hand, an electron injection layer easing injection of electrons and/or a hole blocking layer blocking movement of holes may be further disposed between the second electron transport layer 160 and the second electrode 170.

The electron injection layer and the hole blocking layer may each have a desirably selected thickness. For example, each thickness may be in a range of greater than or equal to about 1 nm and less than or equal to about 500 nm but is not limited thereto. The electron injection layer may be an organic layer formed through deposition but omitted considering a thickness, a material, and the like of the first and second electron transport layers 150 and 160.

The electron injection layer may include for example at least one of 1,4,5,8-naphthalene-tetracarboxylic dianhydride (NTCDA), bathocuproine (BCP), tris[3-(3-pyridyl)-mesityl]] borane (3TPYMB), LiF, $Alq_3$, $Gaq_3$, $Inq_3$, $Znq_2$, $Zn(BTZ)_2$, $BeBq_2$, ET204 (8-(4-(4,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), ET204 (8-(4-(4,6-di(naphthalen-2-yl)-1,3,5-triazin-2-yl) phenyl)quinolone), or a combination thereof, but is not limited thereto.

The hole blocking layer may include for example at least one of 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof and may be omitted considering thicknesses, materials, and the like of other constituent elements of the electroluminescent device 10.

As described above, the electroluminescent device 10 according to an embodiment has a double electron transport layer structure of the first electron transport layer 150 formed of inorganic-organic composite particles and the second electron transport layer 160 formed of inorganic oxide particles, wherein the first electron transport layer 150 has a lower work function than that of the second electron transport layer 160 and also, a higher LUMO energy level than that of the emission layer 140 but a lower LUMO energy level than that of the second electron transport layer 160.

Accordingly, in the electroluminescent device 10 according to an embodiment 10, the first electron transport layer 150 may lower an electron injection barrier and improve electron transport properties.

On the other hand, the first electron transport layer 150 as a cluster layer formed of the inorganic-organic composite particles 151 including the inorganic material cores 151a surface-modified by the organic polymers 151b may prevent a leakage current of the device and improve luminous efficiency thereof.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices have the same structure as the electroluminescent device 10 and but the wavelength of the light emitted from each of the quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing, e.g., displaying, red, green, and blue, respectively, in the display device.

However, an embodiment is not necessarily limited thereto, but the first to third electroluminescent devices may respectively express magenta, yellow, and cyan, or may express other colors.

One of the first to third electroluminescent devices may be the electroluminescent device 10. In this case, the third electroluminescent device displaying at least blue may be desirably the electroluminescent device 10.

In the display device according to an embodiment, a hole injection layer, a hole transport layer, an electron transport layer, an electron injection layer, and a hole blocking layer except an emission layer of each pixel may be integrated to form a common layer. However, an embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, the substrate may include a COC (cyclo olefin copolymer) or COP (cyclo olefin polymer) based material. All the first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one of a scan line, a data line, a driving power source line, a common power source line, or the like, at least two of thin film transistors (TFT) connected to the wire and corresponding to one organic light emitting diode, and at least one capacitor, or the like. The driving circuit may have a variety of the known structures.

As illustrated above, a display device according to an embodiment may prevent a leakage current and improve electron transport properties and thus show excellent photoluminescence characteristics with small, e.g., amount of, electricity.

Hereinafter, embodiments are illustrated in more detail with reference to examples. However, these examples are exemplary, and the present disclosure is not limited thereto.

Preparation Example: Composition for Forming ZnO-PEI Cluster Layer 3.00 millimoles (mmol) of zinc acetate dihydrate, 0.33 mmol to 1.67 mmol of polyethyleneimine, and 60 milliliters (mL) of dimethylsulfoxide are put in a reactor and heated in the air at 60° C. Subsequently, 15 mmol of tetramethylammonium hydroxide pentahydrate is dissolved in 30 mL of ethanol, and a solution obtained therefrom is added in a dropwise fashion to the reactor at a speed of 3 milliliters per minute (mL/min). Then, a composition in the reactor is stirred for 1 hour to prepare a ZnO-PEI inorganic-organic composite. The ZnO-PEI inorganic-organic composite has a ZnO core and polyethyleneimine (PEI) attached thereon.

Subsequently, ethyl acetate is used to centrifuge the ZnO-PEI inorganic-organic composite-including composition to disperse the ZnO-PEI inorganic-organic composite in ethanol to prepare a composition for forming a ZnO-PEI cluster layer.

Comparative Preparation Example: Composition for Forming ZnO Cluster Layer

A composition for forming a ZnO cluster layer is prepared by dispersing ZnO particles having an average particle diameter of 4.5 nm in ethanol.

Example 1

An indium-tin oxide (ITO) layer is deposited on a glass substrate, PEDOT is deposited thereon to form an about 60 nm-thick hole injection layer, and a 25 nm-thick hole transport layer is formed thereon by preparing a composition including 0.7 wt % of TFB (Sumitomo Corp.) in o-xylene and heating it at a high temperature.

Subsequently, a 25 nm-thick blue emission layer is formed on the hole transport layer by coating a composition wherein (directly prepared) blue quantum dots are dispersed in octane and heating it at 80° C.

On the blue emission layer, the composition for forming a ZnO-PEI cluster layer according to Preparation Example is coated and heated at 80° C. to form an about 5 nm-thick ZnO-PEI cluster layer. An amount of PEI in the ZnO-PEI cluster layer is about 5 wt %.

On the ZnO-PEI cluster layer, a ZnO cluster layer as a second electron transport layer is formed by coating ZnO particles having an average particle diameter of 4.5 nm. The ZnO cluster layer is 35 nm thick.

Subsequently, on the electron transport layer, an about 100 nm-thick aluminum (Al) layer is deposited to fabricate an electroluminescent device having the double electron transport layer (ZnO-PEI cluster layer/ZnO cluster layer) according to Example 1.

Example 2

An electroluminescent device having a double electron transport layer (ZnO-PEI cluster layer/ZnO cluster layer) according to Example 2 is fabricated according to the same method as Example 1 except for forming the ZnO-PEI cluster layer to be 10 nm thick and the ZnO cluster layer to be 30 nm thick. An amount of PEI in the ZnO-PEI cluster layer is about 7 wt %.

Example 3

An electroluminescent device having a double electron transport layer (ZnO-PEI cluster layer/ZnO cluster layer) according to Example 3 is fabricated according to the same method as Example 1 except for forming the ZnO-PEI cluster layer to be 15 nm thick and the ZnO cluster layer to be 25 nm thick. An amount of PEI in the ZnO-PEI cluster layer is about 9 wt %.

Example 4

An electroluminescent device having a double electron transport layer (ZnO-PEI cluster layer/ZnO cluster layer) according to Example 4 is fabricated according to the same method as Example 1 except for forming the ZnO-PEI cluster layer to be 20 nm thick and the ZnO cluster layer to be 20 nm thick. An amount of PEI in the ZnO-PEI cluster layer is about 11 wt %.

Comparative Example

An electroluminescent device having a single electron transport layer (a ZnO cluster layer) according to Comparative Example is fabricated according to the same method as Example 1 except for not forming the ZnO-PEI cluster layer to be 20 nm thick but coating the composition for forming a ZnO cluster layer according to Comparative Preparation Example and heating it at 80° C. to form a 40 nm thick ZnO cluster layer right on the blue emission layer.

Evaluation 1: Absorbance of Composition for Forming ZnO-PEI Cluster Layer and Composition for forming ZnO Cluster Layer Absorbance of each cluster layer respectively formed of the composition for forming a ZnO-PEI cluster layer according to Preparation Example and the composition for forming a ZnO cluster layer according to Comparative Preparation Example is measured by using a spectrophotometer (U-3310, Hitachi Ltd.) with a reference to an ethanol baseline, and the results are shown in FIG. 6.

Figure 6:
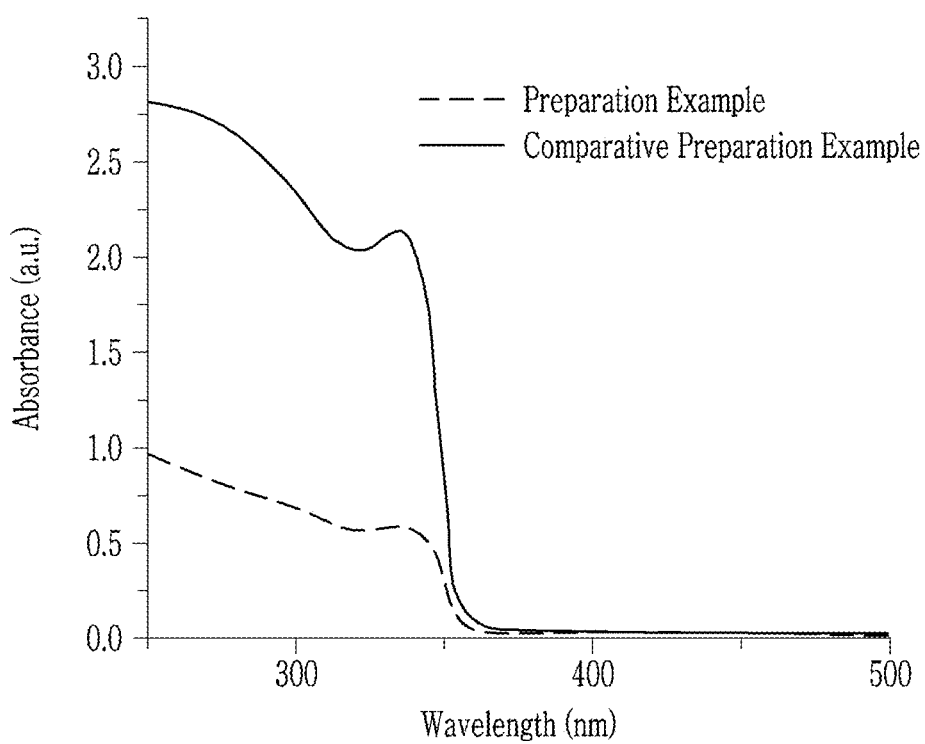
FIG. 6 shows wavelength-absorbance curves of the composition for forming a ZnO-PEI cluster layer according to Preparation Example and the composition for forming a ZnO cluster layer according to Comparative Preparation Example.

FIG. 6 shows each wavelength-absorbance curve of the composition for forming a ZnO-PEI cluster layer according to Preparation Example and the composition for forming a ZnO cluster layer according to Comparative Preparation Example.

Referring to FIG. 6, the composition for forming a ZnO-PEI cluster layer according to Preparation Example shows substantially decreased absorbance in a wavelength region of about 250 nm to 370 nm, compared with the composition for forming a ZnO cluster layer according to Comparative Preparation Example.

In addition, the composition for forming a ZnO cluster layer shows a first exciton peak at about 335 nm, and the composition for forming a ZnO-PEI cluster layer also shows a first exciton peak at the same wavelength. Accordingly, PEI is attached to ZnO and thus decreases optical density compared with that of ZnO but has no influence on the first excition peak.

Evaluation 2: Bandgap Energy and Work Function of Composition for Forming ZnO-PEI Cluster Layer and Composition for Forming ZnO Cluster Layer LUMO and HOMO energy levels and a work function of the composition for forming a ZnO-PEI cluster layer according to Preparation Example and a composition for forming a ZnO cluster layer according to Comparative Preparation Example are respectively measured by using a spectrophotometer (U-3310, Hitachi Ltd.) and ultraviolet (UV) photoelectron spectroscopy (UPS), and the results are shown in Table 1.

TABLE 1

|  | LUMO Energy Level | HOMO Energy level | Work function |
| --- | --- | --- | --- |
| Preparation Example | −3.61 eV | −7.21 eV | 3.405 eV |
| Comparative Preparation Example | −3.94 eV | −7.54 eV | 3.737 eV |

Referring to Table 1, the composition for forming a ZnO-PEI cluster layer (Preparation Example) has a low work function and a high LUMO energy level compared with those of the composition for forming a ZnO cluster layer (Comparative Preparation Example). Accordingly, when both the composition for forming a ZnO-PEI cluster layer and the composition for forming a ZnO cluster layer are used to form an electron transport layer as a double layer, electrons may be easily transported from the ZnO cluster layer to the ZnO-PEI cluster layer.

Evaluation 3: Device Characteristics of Electroluminescent Devices of Examples 1 to 4 and Comparative Example Each voltage-current density relationship, luminance-external quantum efficiency relationship, and voltage-external quantum efficiency relationship of the electroluminescent devices according to Examples 1 to 4 and Comparative Example are respectively shown in FIGS. 7 to 9.

Figure 7:
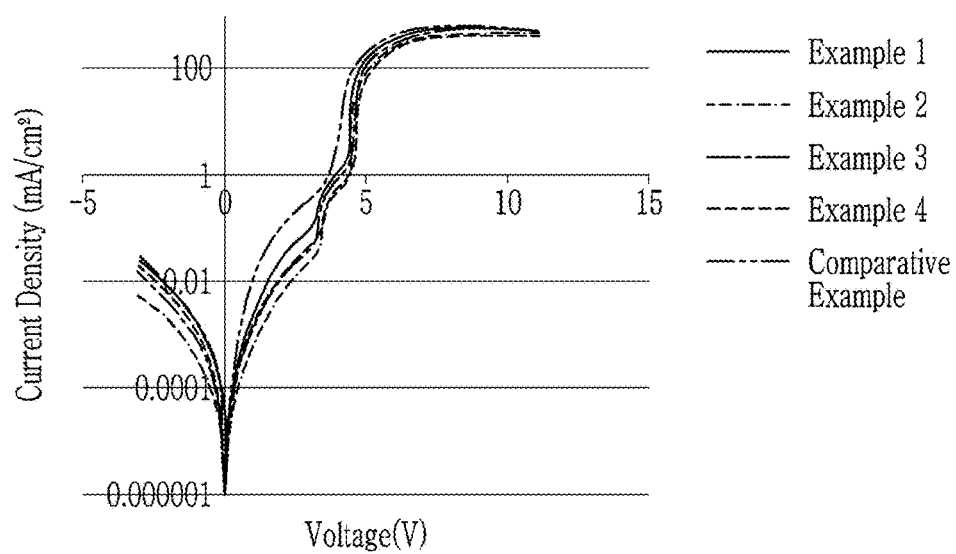
FIG. 7 shows a voltage-current density curve of the electroluminescent devices according to Examples 1 to 4 and Comparative Example.

FIG. 7 shows a voltage-current density curve. In FIG. 7, a current density change depending on a voltage is shown by a log scale.

Referring to FIG. 7, the electroluminescent devices having a double electron transport layer (ZnO-PEI cluster layer/ZnO cluster layer) according to Examples 1 to 4 show increased current density at a voltage of less than or equal to 5 volts (V) compared with the electroluminescent devices having a single electron transport layer (a ZnO cluster layer) according to Comparative Example, and as a thickness of the ZnO-PEI cluster layer is increased, current density is gradually increased. Accordingly, when the emission layer is disposed to contact the ZnO-PEI cluster layer, a leakage current may be prevented.

Figure 8:
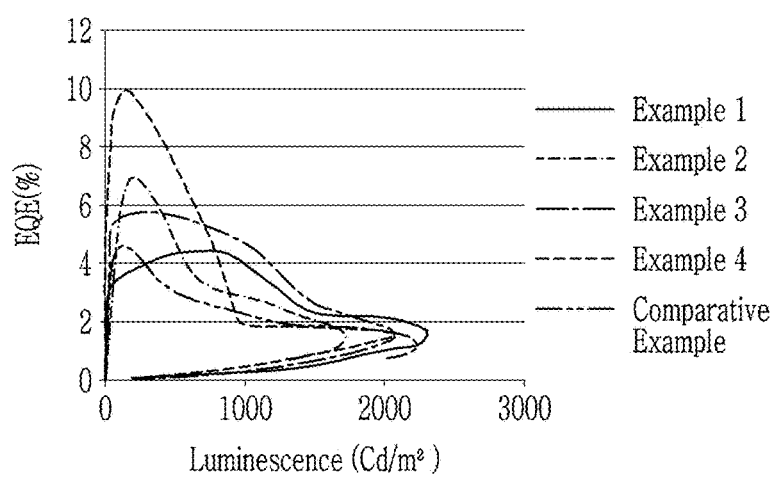
FIG. 8 shows a luminance-external quantum efficiency (EQE) curve of the electroluminescent devices according to Examples 1 to 4 and Comparative Example.

FIG. 8 shows a luminance-external quantum efficiency (EQE) curve.

Referring to FIG. 8, the electroluminescent devices having a double electron transport layer (ZnO-PEI cluster layer/ZnO cluster layer) according to Examples 1 to 4 show excellent external quantum efficiency characteristics depending on luminance compared with the electroluminescent device having a single electron transport layer (ZnO cluster layer) according to Comparative Example.

The electroluminescent device according to Examples 1 shows excellent external quantum efficiency characteristics at greater than or equal to about 500 nits (candelas per square meter) compared with the electroluminescent device according to Comparative Example, but the electroluminescent devices according to Examples 2 to 4 show excellent external quantum efficiency characteristics in a range of 0 nit to about 2000 nits compared with the electroluminescent device according to Comparative Example. In addition, as a thickness of the ZnO-PEI cluster layer is increased, external quantum efficiency depending on luminance also tends to be increased.

Figure 9:
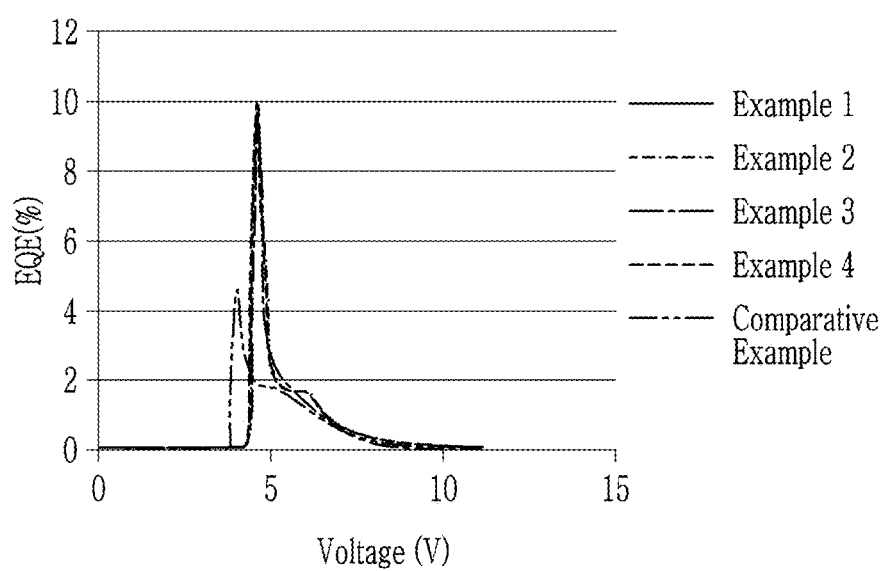
FIG. 9 shows a voltage-external quantum efficiency curve of the electroluminescent devices according to Examples 1 to 4 and Comparative Example.

FIG. 9 shows a voltage-external quantum efficiency curve.

Referring to FIG. 9, the electroluminescent devices having a double electron transport layer (ZnO-PEI cluster layer/ZnO cluster layer) according to Examples 1 to 4 show a slightly increased driving voltage and much improved external quantum efficiency depending on a voltage compared with the electroluminescent device having a single electron transport layer (ZnO cluster layer) according to Comparative Example.

An electroluminescent device 10 according to an embodiment has a double cluster layer formed of inorganic-organic composite particles 151 and another cluster layer formed of inorganic oxide particles 161 as an electron transport layer. Accordingly, since a leakage current in the device may be prevented, electron transport properties may also be improved, the electroluminescent device 10 having improved luminous efficiency may be provided.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. An electroluminescent device, comprising
    a first electrode;
    a hole transport layer disposed on the first electrode;
    an emission layer disposed on the hole transport layer and comprising at least two light emitting particles;
    a first electron transport layer disposed on the emission layer and comprising at least two inorganic-organic composite particles;
    a second electron transport layer disposed on the first electron transport layer and comprising at least two inorganic oxide particles; and
    a second electrode disposed on the second electron transport layer,
    wherein the first electron transport layer has a lower work function than the second electron transport layer.

2. The electroluminescent device of claim 1, wherein each of the inorganic-organic composite particles comprises an inorganic material core and at least two organic polymers bound to a surface of the inorganic material core.

3. The electroluminescent device of claim 2, wherein the organic polymers is present in an amount in a range of about 3 weight percent to about 20 weight percent, based on a total amount of the first electron transport layer.

4. The electroluminescent device of claim 2, wherein the organic polymers comprises at least one of an imine compound, an imine compound, an alcohol compound, an acrylic compound, a glycol compound, or a derivative thereof.

5. The electroluminescent device of claim 2, wherein the inorganic material core comprises at least one of $ZnO$, $TiO_2$, $ZrO_2$, $SnO_2$, $WO_3$, $Ta_2O_3$, or a combination thereof.

6. The electroluminescent device of claim 2, wherein an average particle diameter of the inorganic material cores is less than or equal to about 100 nanometers.

7. The electroluminescent device of claim 1, wherein a difference between lowest unoccupied molecular orbital energy levels of the first electron transport layer and the second electron transport layer is greater than about 0 electronvolts and less than or equal to about 0.5 electronvolts.

8. The electroluminescent device of claim 1, wherein the second electron transport layer is directly on the first electron transport layer.

9. The electroluminescent device of claim 1, wherein the first electron transport layer has a thickness in a range of about 5 nanometers to about 25 nanometers.

10. The electroluminescent device of claim 1, wherein the second electron transport layer has a thickness in a range of about 15 nanometers to about 35 nanometers.

11. The electroluminescent device of claim 1, wherein the second electron transport layer consists of the at least two inorganic oxide particles.

12. The electroluminescent device of claim 1, wherein the inorganic oxide particles comprise at least one of $ZnO$, $TiO_2$, $ZrO_2$, $SnO_2$, $WO_3$, $Ta_2O_3$, or a combination thereof.

13. The electroluminescent device of claim 1, wherein at least one of the light emitting particles has a core-shell structure.

14. The electroluminescent device of claim 1, wherein at least one of the light emitting particles comprises a Group II-VI compound that does not comprise Cd, a Group III-V compound, a Group IV-VI compound, a Group IV element or compound, a Group compound, a Group I-II-IV-VI compound that does not comprise Cd, or a combination thereof.

15. The electroluminescent device of claim 1, wherein the first electron transport layer has a higher lowest unoccupied molecular orbital energy level than the second electron transport layer, and the emission layer has a same lowest unoccupied molecular orbital energy level as the first electron transport layer or a higher lowest unoccupied molecular orbital energy level than the first electron transport layer.

16. A display device comprising the electroluminescent device of claim 1.

* * * * *